(12) United States Patent
Hsu (10) Patent No.: US 10,483,201 B1
(45) Date of Patent: Nov. 19, 2019

(54) SEMICONDUCTOR STRUCTURE AND METHOD FOR MANUFACTURING THE SAME

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/171,700

(22) Filed: Oct. 26, 2018

(51) Int. Cl.
*H01L 29/417* (2006.01)
*H01L 23/525* (2006.01)
*H01L 29/06* (2006.01)
*H01H 85/08* (2006.01)
*H01L 21/768* (2006.01)
*H01L 21/02* (2006.01)

(52) U.S. Cl.
CPC ......... *H01L 23/5256* (2013.01); *H01H 85/08* (2013.01); *H01L 21/02496* (2013.01); *H01L 21/76838* (2013.01); *H01L 29/0649* (2013.01); *H01L 29/417* (2013.01)

(58) Field of Classification Search
CPC ......... H01L 21/02225; H01L 21/02296; H01L 21/02436; H01L 21/02496; H01L 21/02518; H01L 29/66007; H01L 29/68
See application file for complete search history.

(56) References Cited

U.S. PATENT DOCUMENTS

| 6,218,279 B1 | 4/2001 | Weber et al. |
| 2009/0085152 A1 | 4/2009 | Bernstein et al. |
| 2018/0226345 A1 | 8/2018 | Oh |

*Primary Examiner* — Cheung Lee
(74) *Attorney, Agent, or Firm* — Muncy, Geissler, Olds & Lowe, P.C.

(57) ABSTRACT

A semiconductor structure and a method for manufacturing the same are provided. The semiconductor structure includes a semiconductor layer, a first conductor, a second conductor and a fuse. The first conductor is disposed over the semiconductor layer. The second conductor is disposed over the first conductor. The fuse is disposed between the first conductor and the second conductor, wherein the fuse includes a conductive portion and a non-conductive portion surrounded by the conductive portion, the conductive portion is in contact with the first conductor and the second conductor, and the non-conductive portion is in contact with the second conductor.

20 Claims, 5 Drawing Sheets

SEMICONDUCTOR STRUCTURE AND METHOD FOR MANUFACTURING THE SAME

TECHNICAL FIELD

The present disclosure relates to a semiconductor structure and a method for manufacturing the same, and more particularly, to a semiconductor structure with a fuse and a method for manufacturing the same.

DISCUSSION OF THE BACKGROUND

In the semiconductor industry, fuses are necessary for many applications. After the semiconductor device is packaged, fuses can be used to disconnect defective circuits and replace defective circuits with others on a chip.

The fuse can be disconnected by two different processes. In one process, a type of fuse is disconnected by a laser beam; such type of fuse is referred to as a laser fuse. In another process, a type of fuse between two conductors is disconnected by conducting an excessive electrical current through the fuse, resulting in overheating. Such type of fuse is referred to as an electrical fuse, or e-fuse.

After the electrical fuse between two circuits is programmed, heated, and melted by applying an overvoltage, residual heat may still remain in the electrical fuse and other elements adjacent to the electrical fuse. The residual heat may cause a portion of the electrical fuse to generate undesired reconnection between two different circuits in a semiconductor device. In addition, the heat generated by the fuse may cause another adjacent fuse to be melted or affected.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises: a semiconductor layer; a first conductor disposed over the semiconductor layer; a second conductor disposed over the first conductor; and a fuse disposed between the first conductor and the second conductor, wherein the fuse includes a conductive portion and a non-conductive portion surrounded by the conductive portion, the conductive portion is in contact with the first conductor and the second conductor, and the non-conductive portion is in contact with the second conductor.

Another aspect of the present disclosure provides a method for manufacturing a semiconductor structure. The method comprises: forming a first conductor over a semiconductor layer; forming a dielectric layer over the semiconductor layer; forming a first contact hole through the dielectric layer to the first conductor; forming a conductive portion to fill the first contact hole; forming a second contact hole through the conductive portion; and forming a second conductor over the conductive portion to be in contact with the conductive portion.

In some embodiments, the non-conductive portion is in contact with an upper surface of the first conductor and a bottom surface of the second conductor.

In some embodiments, the conductive portion extends vertically from an upper surface of the first conductor to a bottom surface of the second conductor.

In some embodiments, the conductive portion is surrounded by a dielectric layer disposed over the semiconductor layer.

In some embodiments, the non-conductive portion includes an air gap in contact with the second conductor.

In some embodiments, the air gap is in contact with an upper surface of the first conductor.

In some embodiments, the non-conductive portion includes a non-conductive layer in a solid state, the air gap is disposed over the non-conductive layer, and the non-conductive layer is disposed between the air gap and the first conductor.

In some embodiments, the non-conductive portion includes a non-conductive layer in contact with a bottom surface of the second conductor, wherein the non-conductive layer is in a solid state.

In some embodiments, the non-conductive layer is in contact with an upper surface of the first conductor.

In some embodiments, a material of the non-conductive layer is different from a material of a dielectric layer surrounding the conductive portion.

In some embodiments, at least a portion of the non-conductive layer is melted.

In some embodiments, the first conductor is an anode pattern, and the second conductor is a cathode pattern.

In some embodiments, the semiconductor layer includes a semiconductor substrate and a bottom layer disposed over the semiconductor substrate.

In some embodiments, the conductive portion has an outer surface, wherein the outer surface extends continuously from the first conductor to the second conductor.

In some embodiments, the second contact hole is formed through the conductive portion to an upper surface of the first conductor.

In some embodiments, the second contact hole includes an air gap in contact with the second conductor and the first conductor.

In some embodiments, a non-conductive layer and an air gap disposed over the non-conductive layer are formed in the second contact hole, wherein the non-conductive layer is in contact with an upper surface of the first conductor, and the air gap is in contact with the second conductor and the non-conductive layer.

In some embodiments, a non-conductive layer is formed to fill the second contact hole, wherein the non-conductive layer is in contact with the first conductor and the second conductor.

In some embodiments, the first contact hole has an inner surface, wherein the inner surface extends continuously from the first conductor to the second conductor.

Due to the design of the fuse in the semiconductor, the fuse can include a non-conductive portion, such as the air gap or other low-k dielectric material, so a portion of the conductive portion corresponding to the non-conductive portion has a low electrical capacitance and high electrical resistance. Because the capacitance of the fuse can be minimized, the power to heat and melt the fuse can be reduced.

In addition, the fuse may include the first contact hole with continuous inner surface. Thus, the shape of the dielectric layer can be simple, and need not comprise multiple dielectric layers with complicated shapes. As a result, the process for manufacturing the fuse of the semiconductor structure is simpler under the current design than that according to previous designs.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc., indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
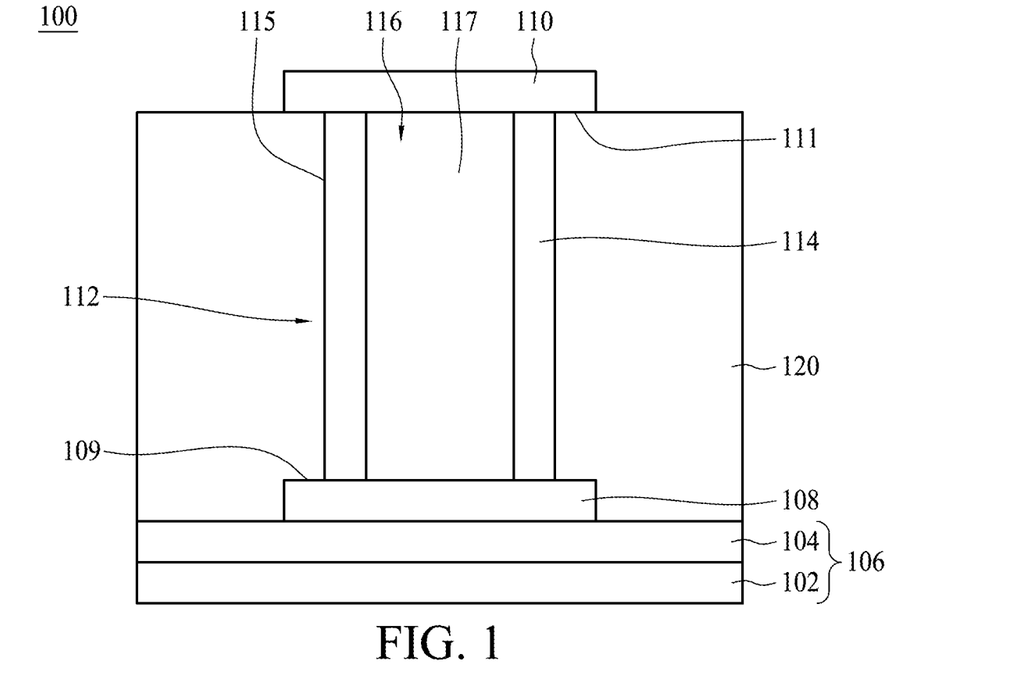
FIG. 1 is a schematic cross-sectional view of a semiconductor structure in accordance with some embodiments of the present disclosure.

FIG. 1 is a schematic cross-sectional view of a semiconductor structure 100 in accordance with some embodiments of the present disclosure. Referring to FIG. 1, in some embodiments, the semiconductor structure 100 includes a semiconductor layer 106, a first conductor 108, a second conductor 110, and a fuse 112.

In some embodiments, the semiconductor layer 106 includes a semiconductor substrate 102 and a bottom layer 104 disposed over the semiconductor substrate 102. In some embodiments, the semiconductor substrate 102 is a silicon substrate or a silicon wafer. In some embodiments, the bottom layer 104 may include a plurality of circuit layers (not shown) and insulating layers (not shown).

In some embodiments, the first conductor 108 is disposed over the semiconductor layer 106, and the second conductor 110 is disposed over the first conductor 108. In some embodiments, the first conductor 108 may be patterned into an anode pattern by a suitable operation, such as photolithography, etching, or the like. In some embodiments, the second conductor 110 may be patterned into a cathode pattern by a suitable operation, such as photolithography, etching, or the like.

In some embodiments, the fuse 112 is disposed between the first conductor 108 and the second conductor 110 to electrically connect the first conductor 108 of a circuit to the second conductor 110 of another circuit in a semiconductor device. In some embodiments, the fuse 112 includes a conductive portion 114 and a non-conductive portion 116, wherein the non-conductive portion 116 is surrounded by the conductive portion 114.

In some embodiments, the conductive portion 114 is in contact with the first conductor 108 and the second conductor 110. In some embodiments, the conductive portion 114 extends vertically from an upper surface 109 of the first conductor 108 to a bottom surface 111 of the second conductor 110. In some embodiments, the conductive portion 114 has an outer surface 115, extending continuously from the upper surface 109 of the first conductor 108 to the bottom surface 111 of the second conductor 110. In some embodiments, the conductive portion 114 is in a hollow cylinder configuration. In some embodiments, the conductive portion 114 includes metal, such as aluminum or the like.

In some embodiments, the conductive portion 114 is surrounded by a dielectric layer 120 disposed over the semiconductor layer 106. In some embodiments, the dielectric layer 120 includes silicon dioxide, oxide or the like.

In some embodiments, the non-conductive portion 116 is in contact with the second conductor 110. In some embodiments, the non-conductive portion 116 is further in contact with the first conductor 108. In some embodiments, the non-conductive portion 116 is in contact with the upper surface 109 of the first conductor 108 and the bottom surface 111 of the second conductor 110. In some embodiments, the non-conductive portion 116 includes a low-k dielectric material, such as air, oxide or the like, so the fuse 112 may require less power to be melted or disabled due to low capacitance.

In some embodiments, the non-conductive portion 116 includes an air gap 117. The air gap 117 is in contact with the second conductor 110. In some embodiments, the air gap 117 is further in contact with the first conductor 108. In some embodiments, the air gap 117 is in contact with the upper surface 109 of the first conductor 108 and the bottom surface 111 of the second conductor 110.

Figure 2:
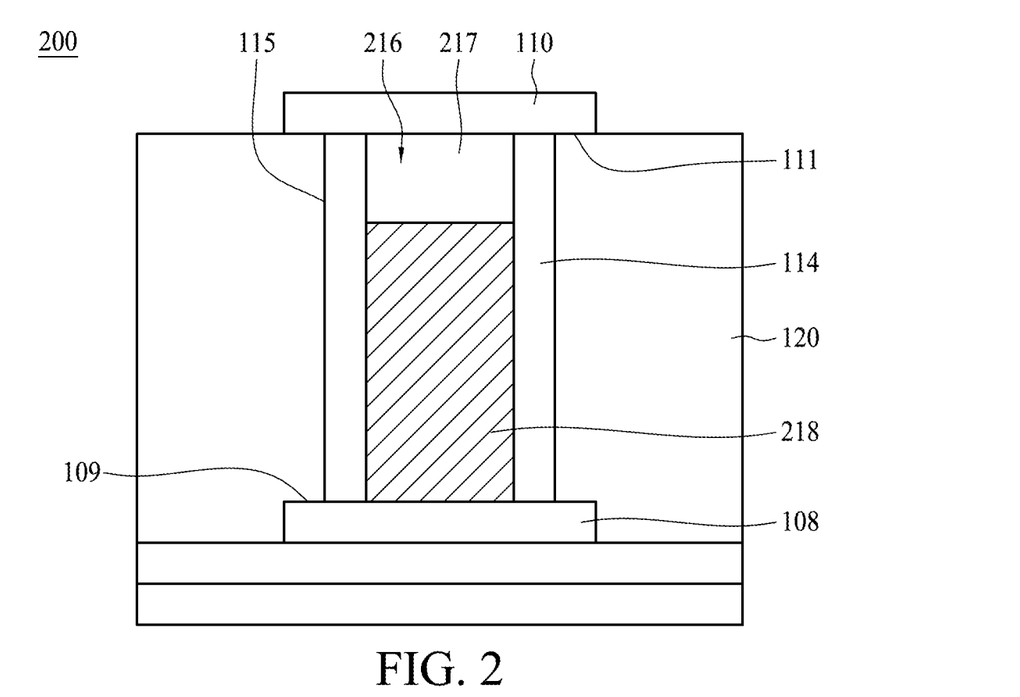
FIG. 2 is a schematic cross-sectional view of a semiconductor structure in accordance with some embodiments of the present disclosure.

FIG. 2 shows a semiconductor structure 200 in accordance with some embodiments of the present disclosure. Referring to FIG. 2, in some embodiments, the semiconductor structure 200 is substantially the same as the semiconductor structure 100 shown in FIG. 1, except the semiconductor structure 200 comprises another type of non-conductive portion 216 having a non-conductive layer 218 in a solid state. In some embodiments, an air gap 217 is disposed over the non-conductive layer 218, and the non-conductive layer 218 is disposed between the air gap 217 and the first conductor 108. In some embodiments, the air gap 217 is in contact with the bottom surface 111 of the second conductor 110, and the non-conductive layer 218 is in contact with the upper surface 109 of the first conductor 108. In some embodiments, the non-conductive layer 218 includes silicon dioxide, oxide or the like.

Figure 3:
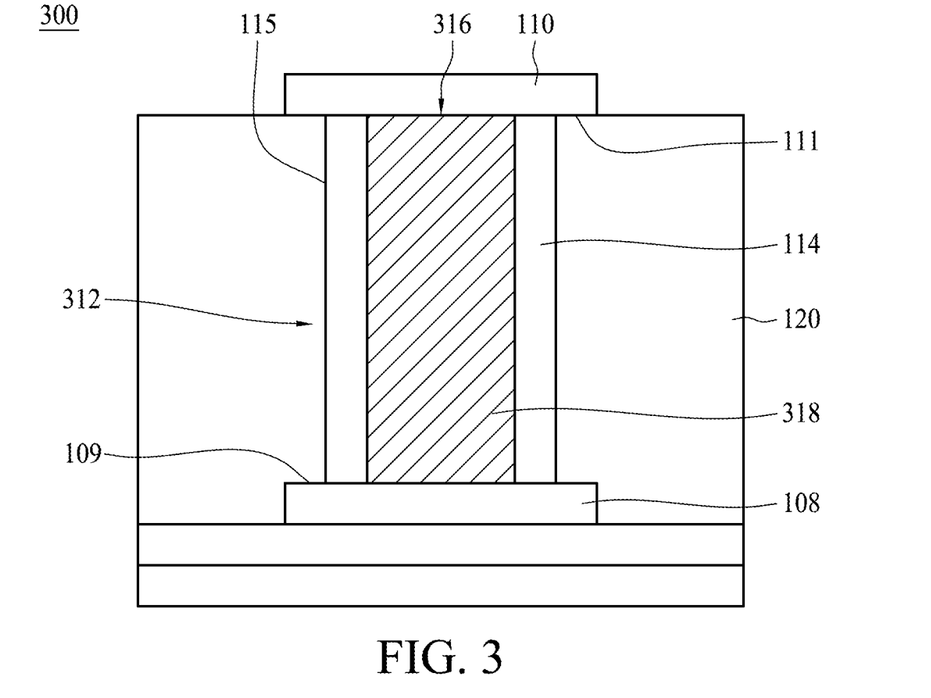
FIG. 3 is a schematic cross-sectional view of a semiconductor structure in accordance with some embodiments of the present disclosure.

FIG. 3 shows a semiconductor structure 300 in accordance with some embodiments of the present disclosure. Referring to FIG. 3, in some embodiments, the semiconductor structure 300 is substantially the same as the semiconductor structure 200 shown in FIG. 2, except the semiconductor structure 300 comprises another type of non-conductive portion 316 having a non-conductive layer 318 in contact with the bottom surface 111 of the second conductor 110. In some embodiments, the non-conductive layer 318 is in a solid state. In some embodiments, the non-conductive layer 318 is in contact with the upper surface 109 of the first conductor 108 and the bottom surface 111 of the second conductor 110. In some embodiments, a material of the non-conductive layer 318 is different from a material of the dielectric layer 120 surrounding the conductive portion 114. In some embodiments, at least a portion of the non-conductive layer 318 is melted to generate a space for melted fuse. In some embodiments, the non-conductive layer 318 includes low-k dielectric material, such as oxide or the like. Thus, the fuse 312 may have low capacitance and require less power to be heated.

Figure 4:
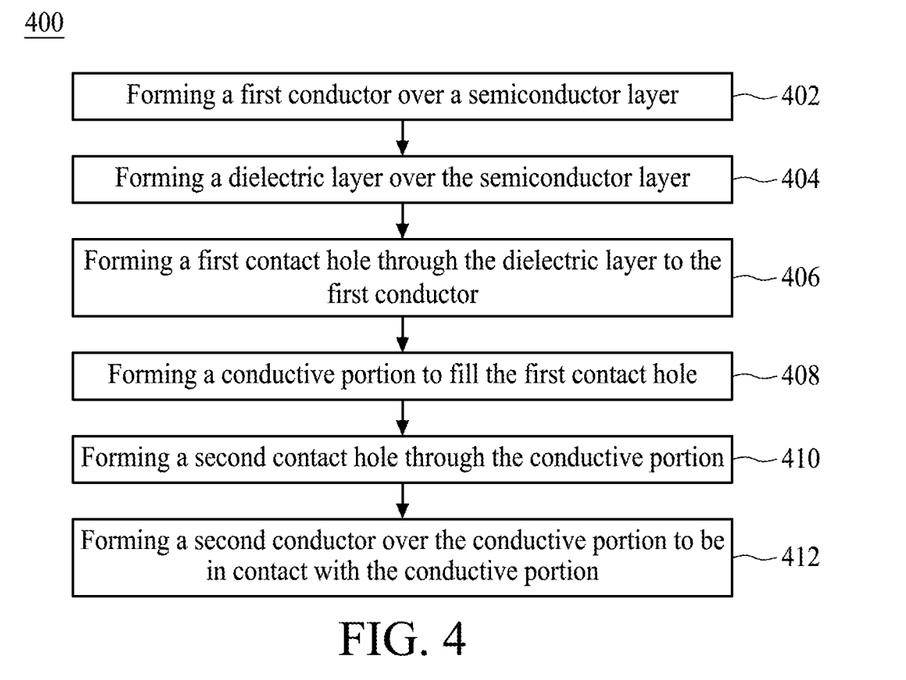
FIG. 4 is a flow diagram of a method for manufacturing a semiconductor structure in accordance with some embodiments of the present disclosure.

FIG. 4 is a flowchart showing a method 400 for manufacturing a semiconductor structure in accordance with some embodiments of the present disclosure. FIGS. 5 to 8 are schematic views of steps of manufacturing a semiconductor structure 100 by the method 400 in FIG. 4 in accordance with some embodiments of the present disclosure. In some embodiments, the method 400 includes a number of operations (402, 404, 406, 408, 410 and 412) and the description and illustrations below are not deemed as a limitation to the sequence of the operations.

Figure 5:
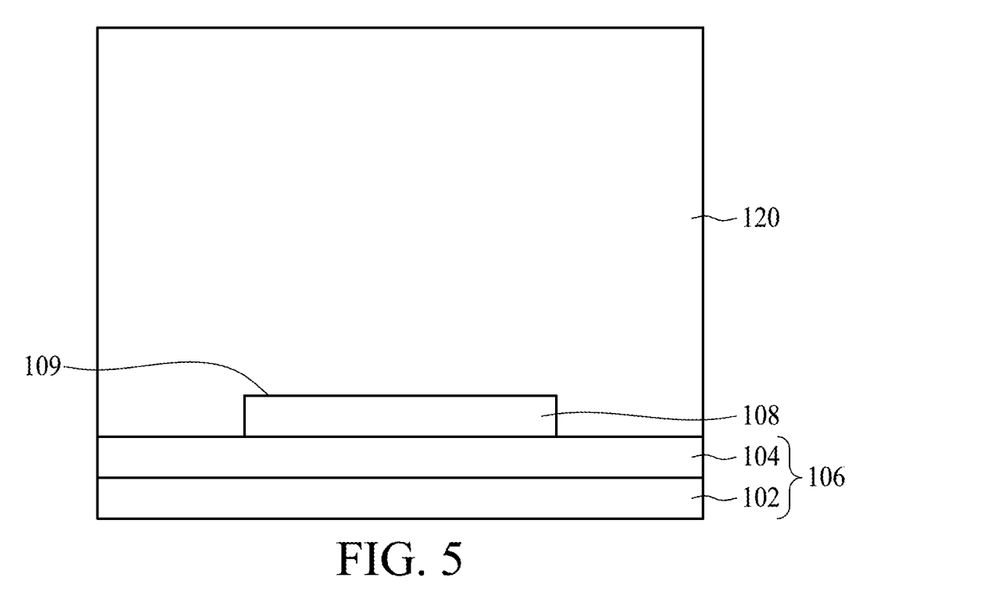
FIGS. 5 to 8 are schematic views of steps of manufacturing a semiconductor structure by the method of FIG. 4 in accordance with some embodiments of the present disclosure.

In operation 402, a first conductor 108 is formed over a semiconductor layer 106, as shown in FIG. 5. In some embodiments, the semiconductor layer 106 includes a semiconductor substrate 102 and a bottom layer 104. The bottom layer 104 is disposed over the semiconductor substrate 102. The semiconductor substrate 102 includes a silicon substrate or a silicon wafer. In some embodiments, the first conductor 108 is patterned into an anode pattern by a suitable operation such as photolithography, etching, or the like. In some embodiments, the bottom layer 104 includes a plurality of circuit layers (not shown) and insulating layers (not shown).

In operation 404, a dielectric layer 120 is formed over the semiconductor layer 106. In some embodiments, the dielectric layer 120 is formed by suitable deposition operations, such as chemical vapor deposition (CVD) or the like. In some embodiments, the dielectric layer 120 includes oxide.

Figure 6:
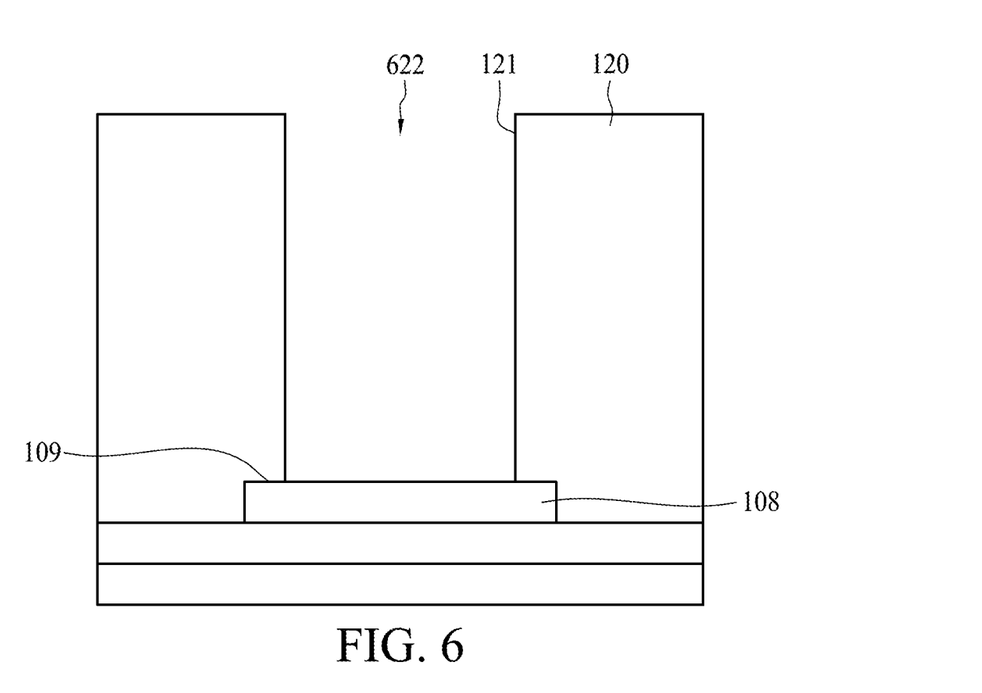

In operation 406, a first contact hole 622 is formed through the dielectric layer 120 to the first conductor 108, as shown in FIG. 6. In some embodiments, at least a portion of the dielectric layer 120 is removed until an upper surface 109 of the first conductor 108 is exposed to form the first contact hole 622. The first contact hole 622 is formed by a suitable operation, such as wet etching or the like.

Figure 7:
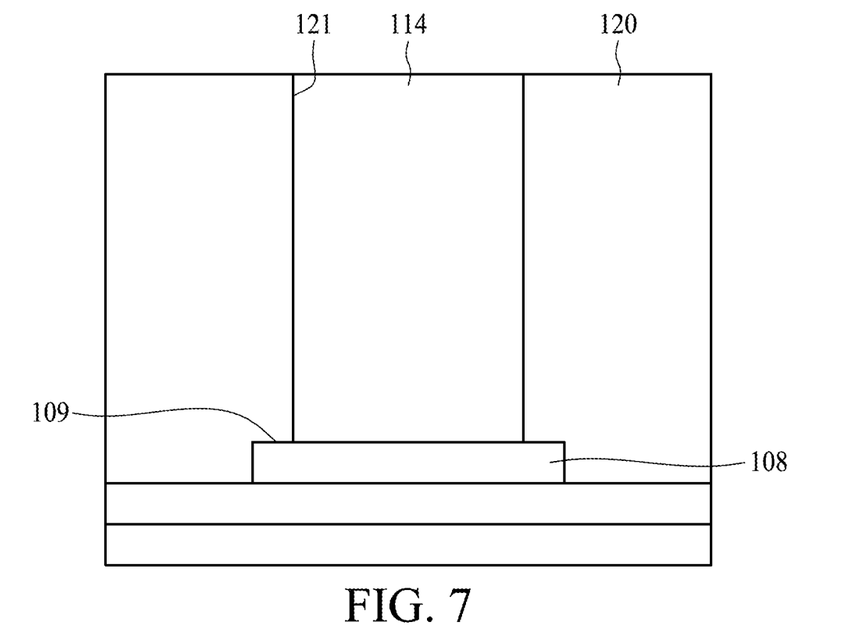

In operation 408, a conductive portion 114 is formed to fill the first contact hole, as shown in FIG. 7. In some embodiments, the conductive portion 114 is formed by suitable deposition operations, such as chemical vapor deposition (CVD) or the like. In some embodiments, the conductive portion 114 includes metal, such as aluminum or the like.

Figure 8:
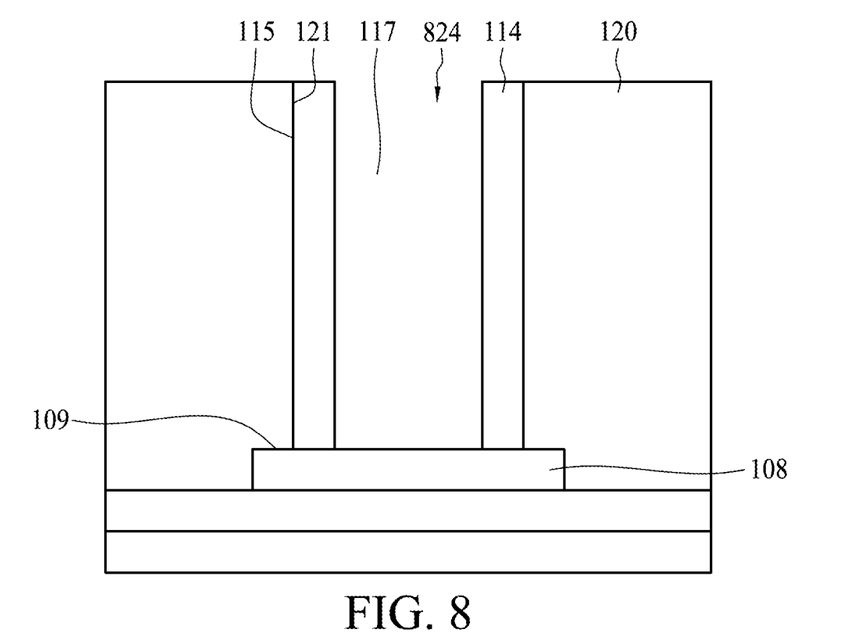

In operation 410, a second contact hole 824 is formed through the conductive portion 114, as shown in FIG. 8. In some embodiments, the second contact hole 824 is formed through the conductive portion 114 to the upper surface 109 of the first conductor 108. In some embodiments, at least a portion of the conductive portion 114 is removed until the upper surface 109 of the first conductor 108 is exposed to form the second contact hole 824.

In operation 412, a second conductor 110 is formed over the conductive portion 114 to be in contact with the conductive portion 114, as shown in FIG. 1. In some embodiments, the conductive portion 114 is electrically connected between the first conductor 108 and the second conductor 110. In some embodiments, the conductive portion 114 is in contact with a bottom surface 111 of the second conductor 110 and the upper surface 109 of the first conductor 108.

In some embodiments, the second contact hole 824 includes an air gap 117. The air gap 117 is formed between the first conductor 108 and the second conductor 110. The air gap 117 is in contact with the second conductor 110 and the first conductor 108. In some embodiments, the second conductor 110 is patterned into a cathode pattern by a suitable operation, such as photolithography, etching, or the like.

In some embodiments, the first contact hole 622 has an inner surface 121, as shown in FIG. 6. The inner surface 121 extends continuously from the first conductor 108 to the second conductor 110. The inner surface 121 is interfaced with an outer surface 115 of the conductive portion 114.

Figure 9:
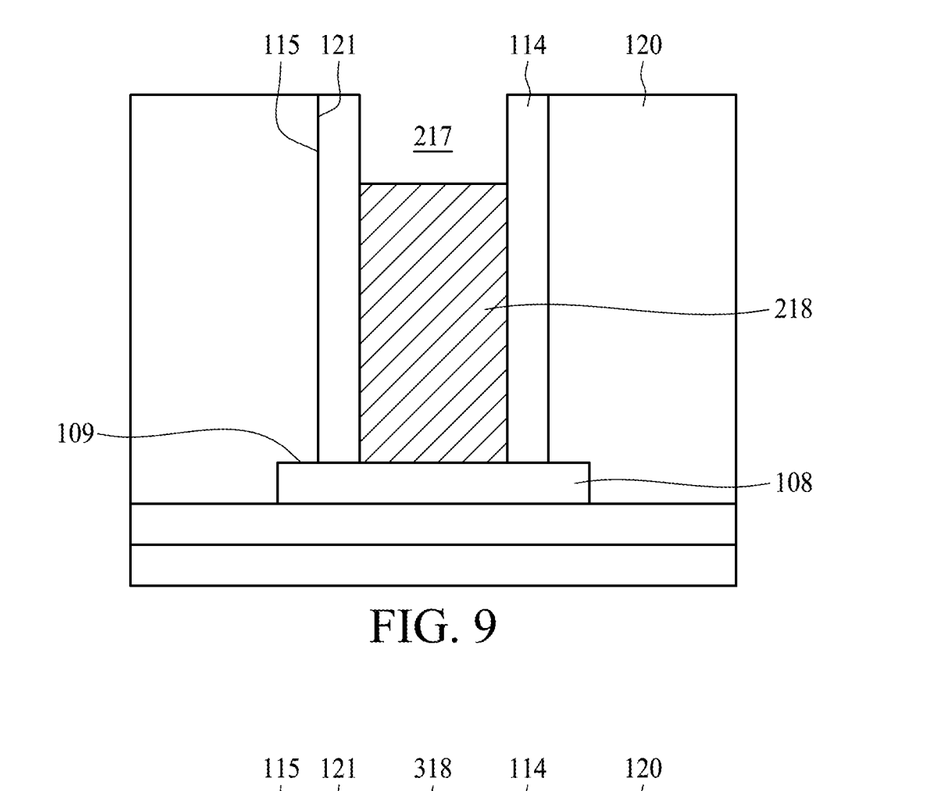
FIG. 9 is a schematic view of a step of manufacturing a semiconductor structure in accordance with some embodiments of the present disclosure.

In some embodiments, between operations 410 and 412, a non-conductive layer 218 and an air gap 217 disposed over the non-conductive layer 218 are formed in the second contact hole, as shown in FIG. 9. After the second conductor 110 is formed, a semiconductor structure 200 is provided as shown in FIG. 2.

The non-conductive layer 218 is in contact with the upper surface 109 of the first conductor 108. In some embodiments, the air gap 217 is in contact with the second conductor 110 and the non-conductive layer 218. In some embodiments, the air gap 217 is in contact with the bottom surface 111 of the second conductor 110, and the non-conductive layer 218 is in contact with the upper surface 109 of the first conductor 108. In some embodiments, the non-conductive layer 218 includes silicon dioxide, oxide or the like. The non-conductive layer 218 is formed by suitable deposition operations such as chemical vapor deposition (CVD) or the like.

Figure 10:
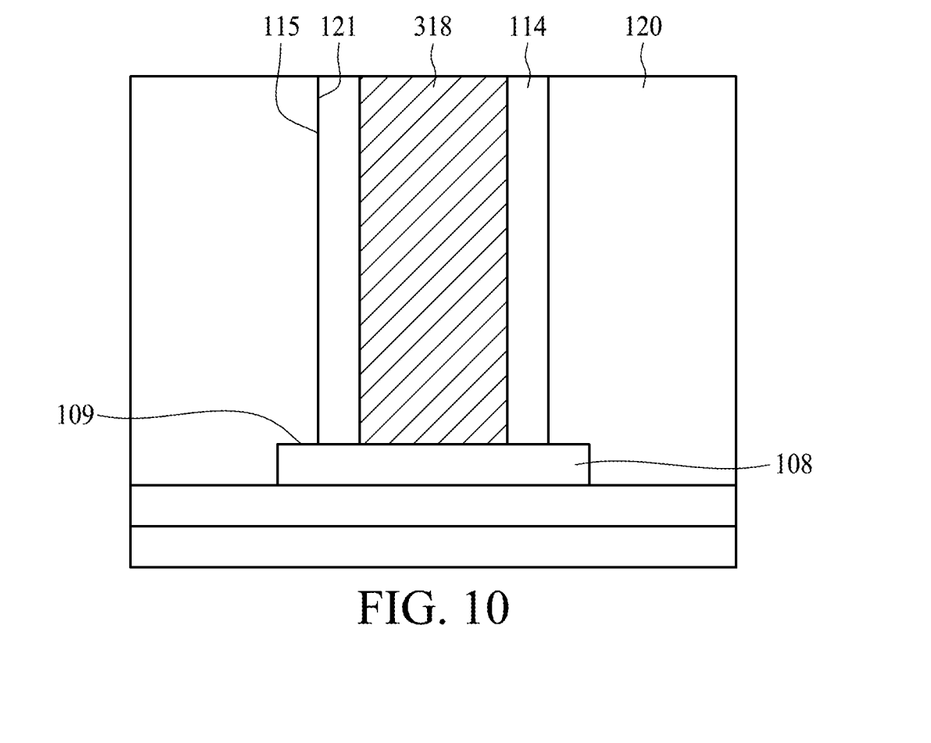
FIG. 10 is a schematic view of a step of manufacturing a semiconductor structure in accordance with some embodiments of the present disclosure.

In some embodiments, between operations 410 and 412, a non-conductive layer 318 is formed to fill the second contact hole as shown in FIG. 10. After the second conductor 110 is formed, a semiconductor structure is provided as shown in FIG. 3.

In some embodiments, the non-conductive layer 318 is in contact with the first conductor 108 and the second conductor 110. In some embodiments, the non-conductive layer 318 includes silicon dioxide, oxide or the like. The non-conductive layer 318 is formed by suitable deposition operations such as chemical vapor deposition (CVD) or the like.

In conclusion, with the configuration of the semiconductor structure, the fuse can have the non-conductive portion, such as the air gap or other low-k dielectric material, so a portion of the conductive portion corresponding to the non-conductive portion has a low electrical capacitance and high electrical resistance. Because the capacitance of the fuse can be minimized, the power to heat and melt the fuse can be reduced.

In addition, the fuse may have the first contact hole with the continuous inner surface. Thus, the shape of the dielectric layer can be simple, and need not comprise multiple dielectric layers with complicated shapes. As a result, the process for manufacturing the fuse of the semiconductor structure is simpler under the current design than that according to previous designs.

One aspect of the present disclosure provides a semiconductor structure. The semiconductor structure comprises: a semiconductor layer; a first conductor disposed over the semiconductor layer; a second conductor disposed over the first conductor; and a fuse disposed between the first conductor and the second conductor, wherein the fuse includes a conductive portion and a non-conductive portion surrounded by the conductive portion, the conductive portion is in contact with the first conductor and the second conductor, and the non-conductive portion is in contact with the second conductor.

Another aspect of the present disclosure provides a method for manufacturing a semiconductor structure. The method comprises: forming a first conductor over a semiconductor layer; forming a dielectric layer over the semiconductor layer; forming a first contact hole through the dielectric layer to the first conductor; forming a conductive portion to fill the first contact hole; forming a second contact hole through the conductive portion; and forming a second conductor over the conductive portion to be in contact with the conductive portion.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a semiconductor layer;
a first conductor disposed over the semiconductor layer;
a second conductor disposed over the first conductor; and
a fuse disposed between the first conductor and the second conductor, wherein the fuse includes a conductive portion and a non-conductive portion surrounded by the conductive portion, the conductive portion is in contact with the first conductor and the second conductor, and the non-conductive portion is in contact with the second conductor.

2. The semiconductor structure of claim 1, wherein the non-conductive portion is in contact with an upper surface of the first conductor and a bottom surface of the second conductor.

3. The semiconductor structure of claim 1, wherein the conductive portion extends vertically from an upper surface of the first conductor to a bottom surface of the second conductor.

4. The semiconductor structure of claim 1, wherein the conductive portion is surrounded by a dielectric layer disposed over the semiconductor layer.

5. The semiconductor structure of claim 1, wherein the non-conductive portion includes an air gap in contact with the second conductor.

6. The semiconductor structure of claim 5, wherein the air gap is in contact with an upper surface of the first conductor.

7. The semiconductor structure of claim 5, wherein the non-conductive portion includes a non-conductive layer in a solid state, the air gap is disposed over the non-conductive layer, and the non-conductive layer is disposed between the air gap and the first conductor.

8. The semiconductor structure of claim 1, wherein the non-conductive portion includes a non-conductive layer in contact with a bottom surface of the second conductor, and the non-conductive layer is in a solid state.

9. The semiconductor structure of claim 8, wherein the non-conductive layer is in contact with an upper surface of the first conductor.

10. The semiconductor structure of claim 8, wherein a material of the non-conductive layer is different from a material of a dielectric layer surrounding the conductive portion.

11. The semiconductor structure of claim 10, wherein at least a portion of the non-conductive layer is melted.

12. The semiconductor structure of claim 1, wherein the first conductor comprises an anode pattern, and the second conductor comprises a cathode pattern.

13. The semiconductor structure of claim 1, wherein the semiconductor layer includes a semiconductor substrate and a bottom layer disposed over the semiconductor substrate.

14. The semiconductor structure of claim 1, wherein the conductive portion has an outer surface, and the outer surface extends continuously from the first conductor to the second conductor.

15. A method for manufacturing a semiconductor structure, comprising:
- forming a first conductor over a semiconductor layer;
- forming a dielectric layer over the semiconductor layer;
- forming a first contact hole through the dielectric layer to the first conductor;
- forming a conductive portion to fill the first contact hole;
- forming a second contact hole through the conductive portion; and
- forming a second conductor over the conductive portion to be in contact with the conductive portion.

16. The method of claim 15, wherein the second contact hole is formed through the conductive portion to an upper surface of the first conductor.

17. The method of claim 15, wherein the second contact hole includes an air gap in contact with the second conductor and the first conductor.

18. The method of claim 15, further comprising: forming a non-conductive layer and an air gap disposed over the non-conductive layer in the second contact hole, wherein the non-conductive layer is in contact with an upper surface of the first conductor, and the air gap is in contact with the second conductor and the non-conductive layer.

19. The method of claim 15, further comprising: forming a non-conductive layer to fill the second contact hole, wherein the non-conductive layer is in contact with the first conductor and the second conductor.

20. The method of claim 15, wherein the first contact hole has an inner surface, and the inner surface extends continuously from the first conductor to the second conductor.

* * * * *